US006768779B1

(12) United States Patent
Nielsen (10) Patent No.: US 6,768,779 B1
(45) Date of Patent: Jul. 27, 2004

(54) PULSE REFERENCED CONTROL METHOD FOR ENHANCED POWER AMPLIFICATION OF A PULSE MODULATED

(75) Inventor: Karsten Nielsen, Holscobro (DK)

(73) Assignee: Bang & Olufsen Powerhouse A/S, Lyngby (DK)

( * ) Notice: Subject to any disclaimer, the term of this patent is extended or adjusted under 35 U.S.C. 154(b) by 0 days.

(21) Appl. No.: 09/381,975

(22) PCT Filed: Apr. 1, 1998

(86) PCT No.: PCT/DK98/00133

§ 371 (c)(1),
(2), (4) Date: Dec. 6, 1999

(87) PCT Pub. No.: WO98/44626

PCT Pub. Date: Oct. 8, 1998

(30) Foreign Application Priority Data

Apr. 2, 1997 (DK) .......................... 1997 00375

(51) Int. Cl.$^7$ .............................. H04K 1/02; H03K 7/08; H03F 3/38; H03M 1/66
(52) U.S. Cl. ...................... 375/297; 375/238; 375/295; 375/296; 327/172; 327/175; 330/10; 332/109; 341/144
(58) Field of Search ................................ 375/297, 295, 375/296, 238; 327/172, 175; 330/10; 332/109; 341/144

(56) References Cited

U.S. PATENT DOCUMENTS

| | | | |
|---|---|---|---|
| 4,140,980 A | | 2/1979 | Cummings |
| 4,724,396 A | | 2/1988 | Taylor, Jr. et al. |
| 5,077,539 A | * | 12/1991 | Howatt .................... 330/10 |
| 5,378,933 A | * | 1/1995 | Pfannenmueller et al. .. 327/172 |
| 5,451,893 A | | 9/1995 | Anderson |
| 5,506,532 A | * | 4/1996 | Milazzo ................ 327/175 |
| 5,521,549 A | | 5/1996 | Nelson |
| 5,594,324 A | | 1/1997 | Canter et al. |
| 5,617,058 A | * | 4/1997 | Adrian et al. ............. 330/10 |
| 5,708,433 A | * | 1/1998 | Craven .................... 341/144 |
| 5,963,106 A | * | 10/1999 | Blyth et al. .............. 332/109 |
| 6,466,087 B2 | * | 10/2002 | Ruha ..................... 330/10 |

FOREIGN PATENT DOCUMENTS

| | | |
|---|---|---|
| JP | 61-039708 | 2/1986 |
| WO | WO 92/11699 | 7/1992 |
| WO | WO 97/37433 | 10/1997 |

OTHER PUBLICATIONS

J. Audio Engineering Society, vol. 44, No. 7/8, Jul./Aug. 1996, Niels Anderskouv et al., High Fidelity PWM Switching Amplifiers Based on Novel Double–Loop Feedback Techniques, p. 649, Abstract.

* cited by examiner

Primary Examiner—Stephen Chin
Assistant Examiner—Sam K. Ahn
(74) Attorney, Agent, or Firm—Nixon Peabody LLP; David S. Safran (57) ABSTRACT

To correct for any source of non-linearity and noise introduced in the power amplification of a pulse modulated signal, a correction unit is applied in-between the pulse modulator and the switching power amplification stage. The correction unit is controlled to have a compensating effect, by introducing continuous delays on the individual pulse edges on the basis of error information provided by an error processing block. One preferred embodiment of the invention comprises: a Correction Unit with means to control the delays of the individual pulse edges as a function of a control input signal $V_e$; a state feedback block A with compensation; a reference shaping block R to modify the pulsed reference $v_r$ for optimized error estimation; a difference block to generate an error signal and a compensator C to shape this error. The invention makes it possible to implement practical digital to analog power conversion, with efficient compensation of any non-linearity and noise introduced in the switching power stage and filter, such that great efficiency, high performance and low system complexity is combined. Applications are direct digital to audio power conversion and improved general DC-DC or DC-AC power conversion systems controlled from the digital domain.

21 Claims, 7 Drawing Sheets

PULSE REFERENCED CONTROL METHOD FOR ENHANCED POWER AMPLIFICATION OF A PULSE MODULATED

TECHNICAL FIELD

This invention relates to power amplification of pulse modulated signals by a switching power stage. The invention may advantageously be used for improved conversion of a digital signal directly to analog power. Applications are direct digital audio power conversion and general DC-DC or DC-AC power conversion systems controlled from the digital domain.

BACKGROUND

The advantages of power amplification based on a switching power stage are well known. The high efficiency provides several advantages, in terms of minimal weight and volume, higher power handling capability and improved reliability. The fundamental elements in switching power amplification are the modulator, the switching power stage and the demodulation filter to reconstitute the modulated signal. The non-linearity of the switching power stage presents a significant impediment to maintain the modulator performance throughout the subsequent power conversion by a switching power stage. This problem is fundamental and independent on the use of analog modulation as analog PWM, or digital modulation as direct digital PCM-PWM conversion.

In prior art, compensation for the non-ideal behavior has generally been attempted with various feedback control methods. U.S. Pat. No. 4,724,396 and U.S. Pat. No. 5,521,549 discloses examples of this method with audio power amplification as specific application. However, linear feedback control methods require an analog low frequency reference. It is desirable with a more direct digital source to power conversion to simplify the power conversion in that no separate D/A converter is needed. Furthermore, analog modulation circuitry and carrier generators will not be required. International patent application no. WO92/11699 and international patent application no. WO97/37433 discloses improved methods for digital PCM-PWM conversion for digital digital to power amplification. In practice, these systems are hardly easy to implement, since compensation for the fundamental error sources within the switching power conversion are not provided. The application of digital feedback control referenced to the digital source is complicated in that an analog—digital converter is needed in the feedback path. This renders normal feedback control impractical.

The published international patent application EP758164 discloses a feedback method local to the switching power stage, in which the power stage output is feed back and summed with a pulse width modulated input. The resulting signal is used to drive the switching power stage. The compensation effect however will be limited and it is difficult to control the improvements towards all error sources.

In conclusion, no invention in prior art exist for general power amplification of a pulse-modulated signal, that incorporates simple and effective means to eliminate any source of non-linearity and noise in the switching power amplification stage.

Accordingly, the primary objective of the present invention is to enable improved power amplification of a pulse modulated signal, where all error sources related to the power stage and demodulation filter are eliminated, such that the modulator performance can be maintained throughout the subsequent elements all the way to the output. Another objective of the invention is to provide a practical digital PCM—power conversion system, that is insensitive to power stage non-linearity, perturbation on the power supply and any other non-ideal elements.

SUMMARY OF THE INVENTION

According to claims 1 and 2, the objectives of the invention are achieved by the introduction of a correction unit in-between the pulse modulator and the switching power amplification stage. The correction unit provides compensation by means of pulse re-timing on the pulse edges, said re-timing controlled to have a "predistorting" effect, such that the resulting switching power stage output is free from distortion, noise or any other undesired contribution.

According to claim 3, one preferred embodiment of the invention is particular in that pulse re-retiming in the correction unit is a linear function of an error signal input. This is advantageous in that the resulting control system is linear, whereby system design and optimization is simplified and the performance improvement controllable.

According to claim 4, it is expedient that the pulse reference control system comprises the following fundamental elements:

An input terminal taking a pulse modulated signal.

A Correction Unit with means to correct the delays of the individual pulse edges, controlled by a control input.

A state feedback with compensation.

A reference-shaping block to modify the pulsed reference input for optimal error estimation.

A difference block to generate an error signal and a compensator to shape this error.

The invention includes various embodiments regarding actual realization of the control function within the correction unit. According to claims 6–10, the invention includes various advantageous embodiments concerning improved digital—analog power conversion suitable for audio power amplification.

The invention is a fundamentally new control method for improved amplification of a pulse modulated input signal. The application range is extremely broad in that the invention can be used with any pulse-modulated input, modulated in the analog or digital domain, and feed any load where a pulsed power signal of controllable quality is needed. Ultimately, the principle of the invention may realize perfect reproduction of the pulsed reference such that the output is a constant times the input, independent on any disturbances that is introduced during power conversion.

BRIEF DESCRIPTION OF THE DRAWINGS

The invention will be further described with reference to the drawings in which.

DETAILED DESCRIPTION

To fully understand the invention it is helpful to discuss the fundamental physical limitations that lies within amplification of a pulse modulated signal to power levels. Most problems relate to the switching power stage that serves to amplify the pulses coming from the modulator. It is expedient to divide the error sources in to pulse timing errors (PTE) and pulse amplitude errors (PAE). Pulse Timing Errors arise from:

Delays from turn-on or turn-off to the actual transition at the output of the switching power stage are different in the turn-on and turn-off case. The delays depend on various parameters in the power switch physics and in the hardware, that drives the switches.

The delay between a turn-off and the following turn-on in a switching leg.

The finite rise- and fall-times as opposed to the infinitely fast switching required by theory.

Pulse Amplitude Errors (PAE) mainly arise from:

Noise from the power supply that feeds the switching power stage. Any power supply ripple or noise will intermodulate with the modulated audio signal, and the switching power stage has a Power Supply Rejection Ratio (PSRR) of 0 dB.

Finite impedance for the power switches.

High frequency resonant transients on the resulting pulse power signals.

There are additional error sources relating to the non-ideal modulation and non-ideal demodulation. The demodulation filter errors may introduce further distortion, since magnetic core materials are not ideal. In addition, the filter increases the total output impedance. Accordingly, changes in load impedance will distort the frequency response.

Figure 1:
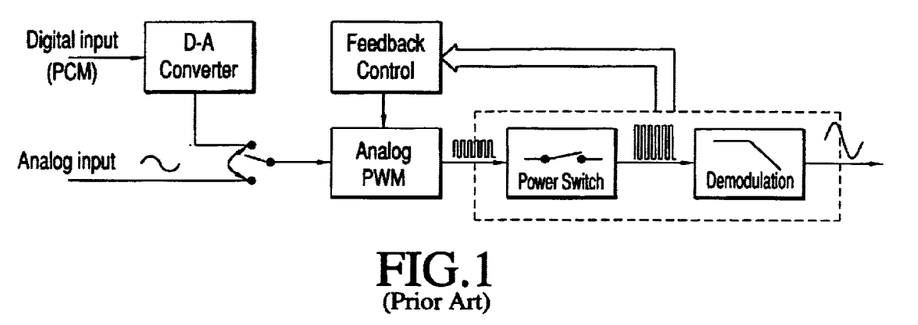
FIG. 1 shows a principle of power amplification based on either analog or digital input that is well known to the art.

FIG. 1 shows a method, well known in the art, to realize power amplification based on analog pulse modulation techniques. The modulator output feeds a switching power stage, the output of which is demodulated and feed to the load. A linear control system referenced to the analog input serves to minimize the errors within the power conversion, such that the effects of the above mentioned errors can be minimized. A digital input requires a separate D/A converter to generate the analog input that serves as input to the control system.

Figure 2:
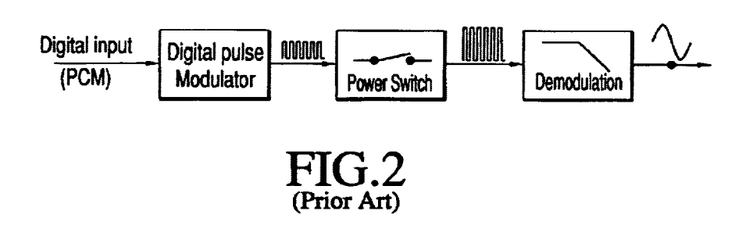
FIG. 2 shows a method of power conversion based on digital pulse modulation. This approach is well known to the art.

FIG. 2 illustrates the simplified and desirable system for direct digital to analog power conversion using digital pulse modulation techniques, also well known in prior art. The application of error feedback control is complicated in that an analog/digital converter would be needed to enable comparison with the digital reference source. This compromises both performance and complexity and renders the method impractical.

Figure 3:
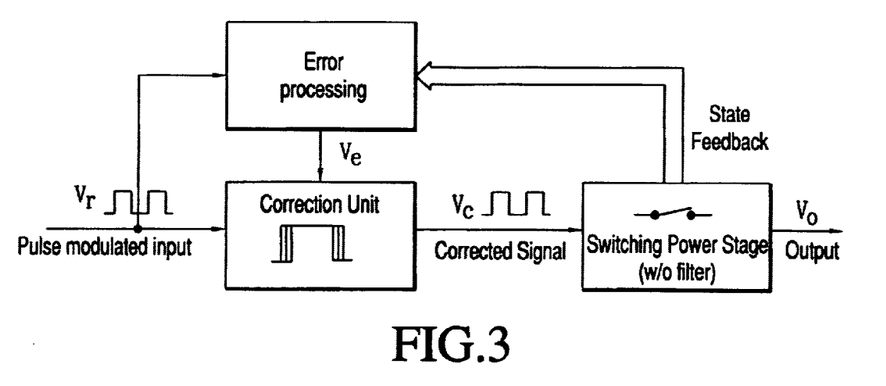
FIG. 3 shows a general model of the invention.
Figure 4:
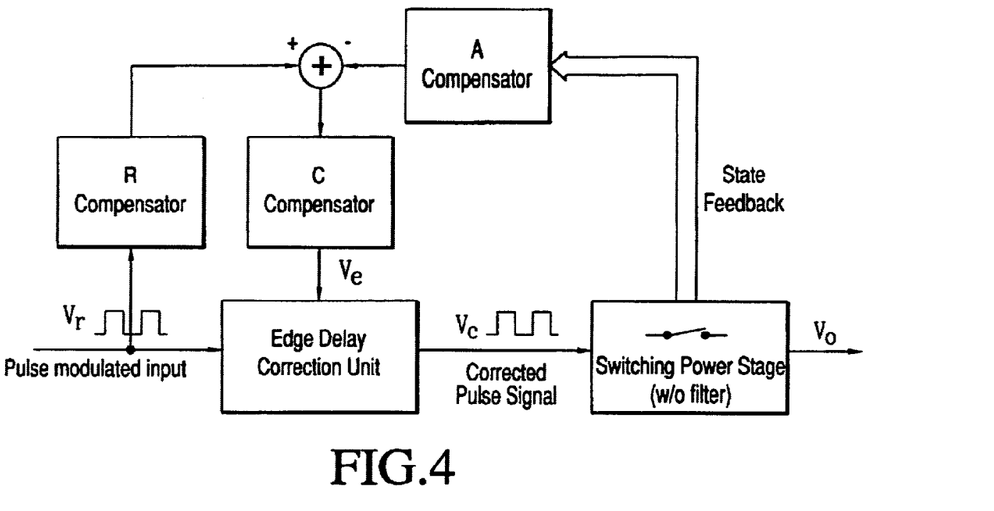
FIG. 4 shows a preferred embodiment of the invention, in terms of a dual input pulse referenced control method based on state feedback from the power stage.

The new principle of the invention is shown by the general block diagram in FIG. 3. The modulator is feed to a correction unit that serves to correct or "predistort" the pulse modulated signal $v_r$ to generate the compensated pulse signal $v_c$, such that the said non-ideal behavior within the subsequent power conversion and demodulation are eliminated. This is carried out by means of intelligent pulse edge delays on each of the pulse edges, controlled by an input control signal $v_e$ to the correction unit. The method will henceforth be referenced to as Pulse Edge Delay Error Correction (PEDEC).

The invention is a fundamentally new control method for improved amplification of a pulse modulated input signal. The application range is broad in that the invention can be used with any pulse-modulated input, modulated in the analog or digital domain, and feed any load where a pulsed power signal of controllable quality is needed.

The invention relies on two fundamental facts:

The pulse modulator can generate a very high quality pulsed waveform, that may be used as reference for the control system.

All error sources (PAE or PTE) within the switching power conversion can be corrected by intelligent pulse re-timing and all error sources only need minor pulse edge re-timing for perfect elimination.

Figure 5:
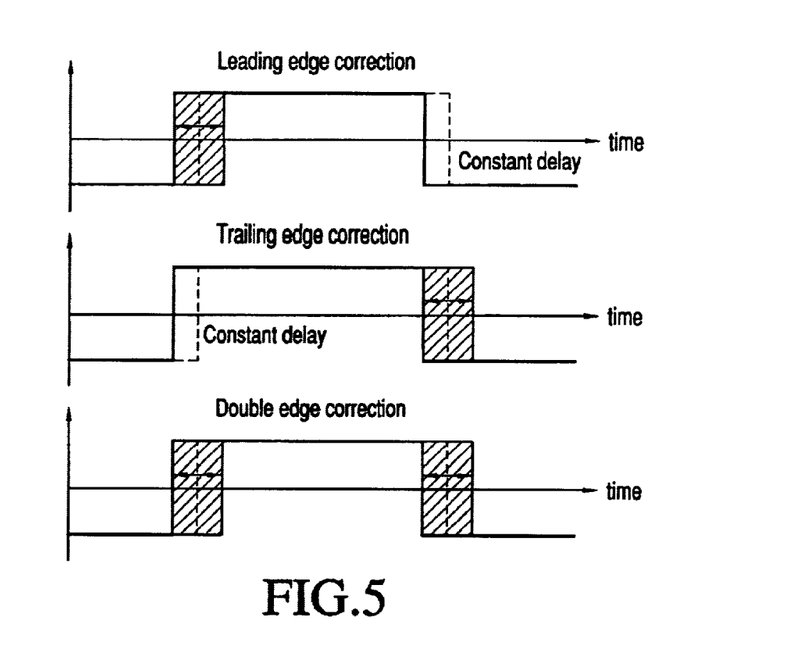
FIG. 5 shows various embodiments of the invention regarding pulse edge delay error correction methods.

The edge correction may be implemented using single-sided or double-sided edge delay correction, as shown conceptually in FIG. 5. The choice of single or double edge correction is independent of the type of modulation method. The control of both edges leads to efficient correction and furthermore has simple implementation strategies. Subsequently, the following description of this aspect of the invention will focus on double edge correction.

Figure 6:
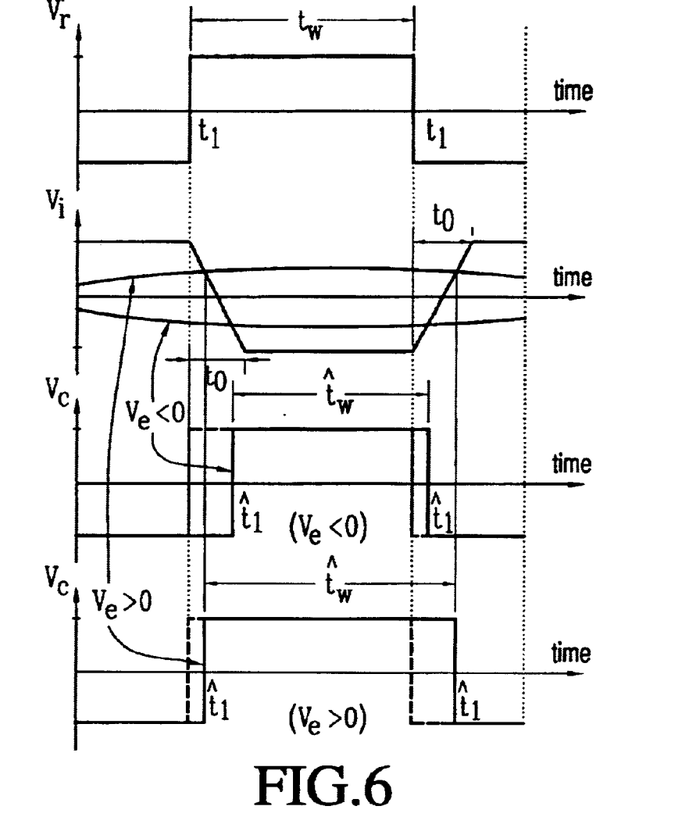
FIG. 6 shows the principle for one preferred embodiment of the invention regarding edge delay correction unit implementation that implements the expedient linear control function, by operating on both edges of the pulse.

One preferred embodiment of the invention is shown FIG. 6. The dual input pulse referenced feedback control system comprises:

An input terminal that is feed by a pulse modulated reference signal $v_r$.

A Correction Unit (PEDEC unit) with means to control the delays of the individual pulse edges and generate the corrected output pulse signal $v_c$.

A state feedback block A including compensation from the power stage block.

An optional reference shaping block R.

A subtraction unit to derive error information.

A compensator C to shape said error and feed the Correction Unit with said shaped error $v_e$.

The correction unit may be realized by various linear and also non-linear methods. A particularly advantageous embodiment of the invention regarding PEDEC unit realization is described hereinafter. It proves advantageous to let the control error signal $v_e$ to the PEDEC unit realizes an effective change in pulse width $\Delta t_w$ at the end of each switching cycle that is proportional to the control signal input $v_e$:

$$\frac{dt_w}{dv_e} = k_w \quad (1)$$

By averaging within a single switching cycle, the relationship between an increment in pulse width $\Delta t_w$ and the corresponding, change in the average ox the PEDEC unit output $\Delta \bar{v}_c$ can be established. Assume for simplicity in the following that the PEDEC unit output pulse amplitude is unity. $\Delta \bar{v}_c$ is related to $\Delta t_w$ as:

$$\Delta \tilde{v}_c = \frac{1}{t_s}\left(\int_0^{d \cdot t_s + \Delta t_w} 1 \cdot dt + \int_{d \cdot t_s + \Delta t_w}^{t_s} (-1) \cdot dt\right) = \frac{2}{t_s}\Delta t_w \quad (2)$$

Where d is the duty-cycle within the present switching cycle and $f_s$ is the switching period. Hence:

$$\frac{d\tilde{v}_c}{dt_w} = \frac{2}{t_s} \quad (3)$$

Combining and (1) and (3), the linear control function arrives:

$$k_{PEDEC} = \frac{d\tilde{v}_c}{dv_e} = \frac{2k_w}{t_s} \quad (4)$$

This preferred linear control function is advantageous in that it simplifies controller design and provides controllable performance improvements compared to e.g. the implementation of a non-linear control function.

A preferred embodiment of the invention is particular in that the implementation of a double-sided correction unit that implements (4) is simple. The method is shown in FIG. 6. The linear control function is realized by a limited integration of the reference $v_r$, thus generating the signal $v_i$. A comparison between the modified reference with the control signal $v_e$ caused the pulse edges to be re-timed. From FIG. 6 in follows that:

$$\hat{t}_w = t_w - t_0 \frac{v_e}{V_l} \Rightarrow \quad (5)$$

$$\Delta t_w = \hat{t}_t - \hat{t}_t = \begin{cases} t_0 & (v_e > 1) \\ t_0 v_e & (-1 \le v_e \le 1) \\ -t_0 & (v_e < 1) \end{cases}$$

Where (^) indicates the corrected variable after passing the PEDEC unit. It is assumed that all pulse amplitudes are normalized to unity. In this preferred implementation, $k_w$ as defined in (1) is:

$$k_w = \frac{dt_w}{dv_e} = t_0 \quad (6)$$

The following equivalent control gain emerge for the proposed implementation of double sided edge correction:

$$k_{PEDEC} = \frac{2t_0}{t_s} \quad (7)$$

Figure 7:
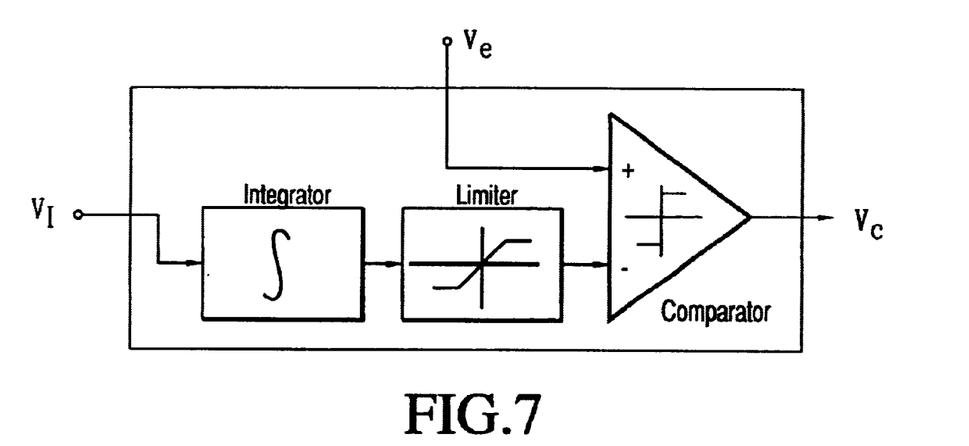
FIG. 7 shows a system block diagram for one preferred implementation for a double-sided edge delay correction unit.

FIG. 7 shows a preferred implementation of the double-sided edge correction method. The method is very simple and straightforward.

For optimal control in this preferred solution, the pulses should have a certain minimal width. The minimum pulse width for optimal performance is related to the modulation index M and switching period $t_s$ as:

$$t_{w,min} \ge t_0 \Rightarrow M_{max} = 1 - \frac{2t_0}{t_s} \quad (8)$$

This constraint on pulse width and maximal modulation index $M_{max}$ does not present a fundamental limitation, since the correction still will work partially beyond this limit. Since only a limited correction range is generally needed, $t_0$ is preferably on order of magnitude or more lower that $t_i$.

Figure 8:
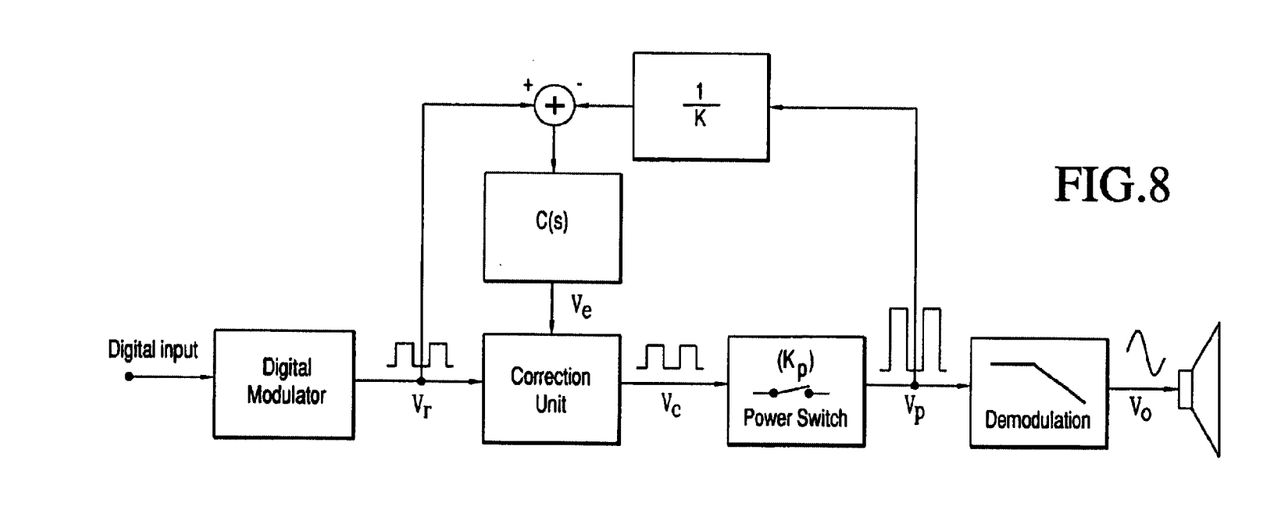
FIG. 8 shows an advantageous application of the invention, in terms of a digital—power conversion system for audio purposes, where the reference shaping block R is unity and the feedback block A has a constant attenuation characteristic.

The invention includes several embodiments regarding the application of the invention specifically in digital to analog power conversion. One preferred embodiment is the system shown in FIG. 8. Using PEDEC in combination with one of the high performance digital pulse width modulation methods (PCM-PWM methods) that are known to the art, the signal will remain digital or pulsed throughout the main audio chain. No analog modulator or carrier generator is needed as with analog pulse modulation, since the system is controlled exclusively by the digital modulator. In this particular embodiment of the invention, the state feedback is a voltage feedback from the switching power stage output $v_p$. The feedback path compensator is a simple attenuation, and the compensator block C(s) is a linear filter. Despite the simple controller structure of this particular embodiment, the system introduces a very powerful and flexible control of system performance.

Figure 9:
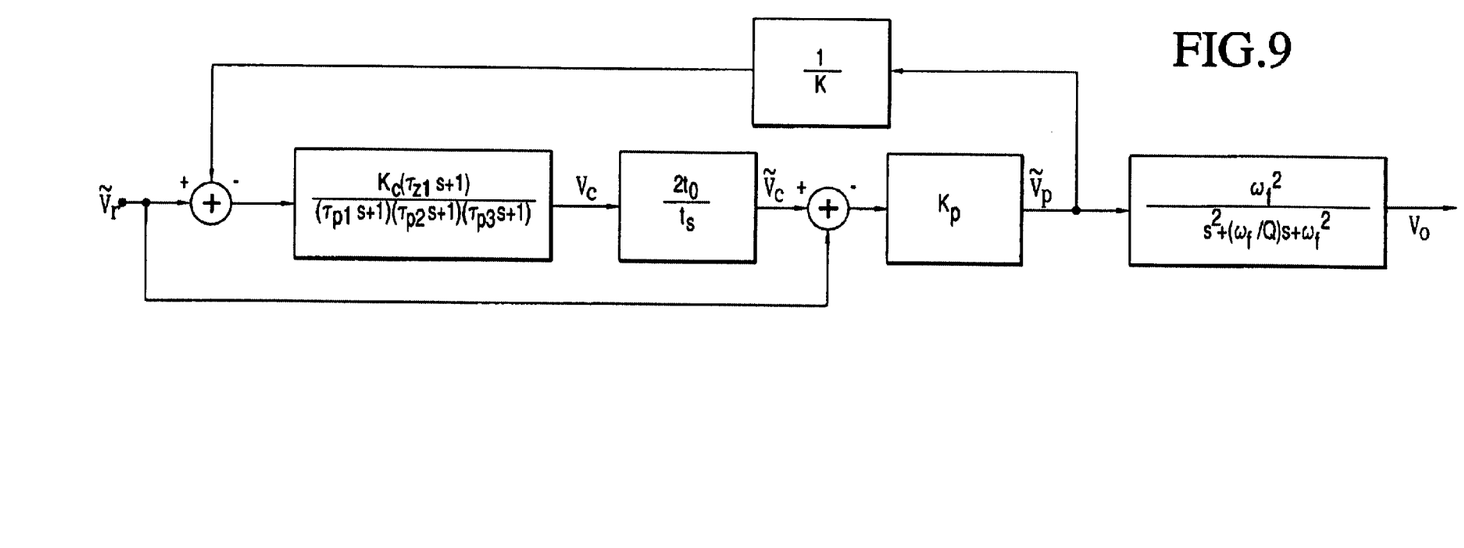
FIG. 9 shows a linear model for the advantageous application of the invention in FIG. 8. The model defines an appropriate compensator for the application.

The preferred linear control function provides great flexibility in performance optimization. An example of PEDEC control system design is specified in the following. The compensator is defined in the linear model of the system as shown in FIG. 9. The PEDEC unit has been replaced by its equivalent linear gain and the resulting system has been redrawn to emphasize the dual input character of the PEDEC based digital to power conversion system. The specified compensator provides sufficient flexibility to optimize the performance to various characteristics. The resulting loop transfer function is derived directly from the system model:

$$L(s) = \frac{K_p k_{PEDEC}}{K} C(s) = \frac{K_C K_p k_{PEDEC}}{K} \frac{\tau_{p1}s + 1}{(\tau_{p1}s + 1)(\tau_{p2}s + 1)(\tau_{p3}s + 1)} \quad (9)$$

All non-ideal effect as noise, distortion or power supply perturbations that influence the power stage gain $K_p$ are reduced by the sensitivity function $S(s) = (1+L(s))^{-1}$. The actual loop shaping is a compromise between loop bandwidth and the desired sensitivity function. Further considerations are stability and robustness to uncertainty in system parameters. Table 1 gives as set of normalized system parameter values that will lead an appealing compromise between these aspects.

Figure 12:
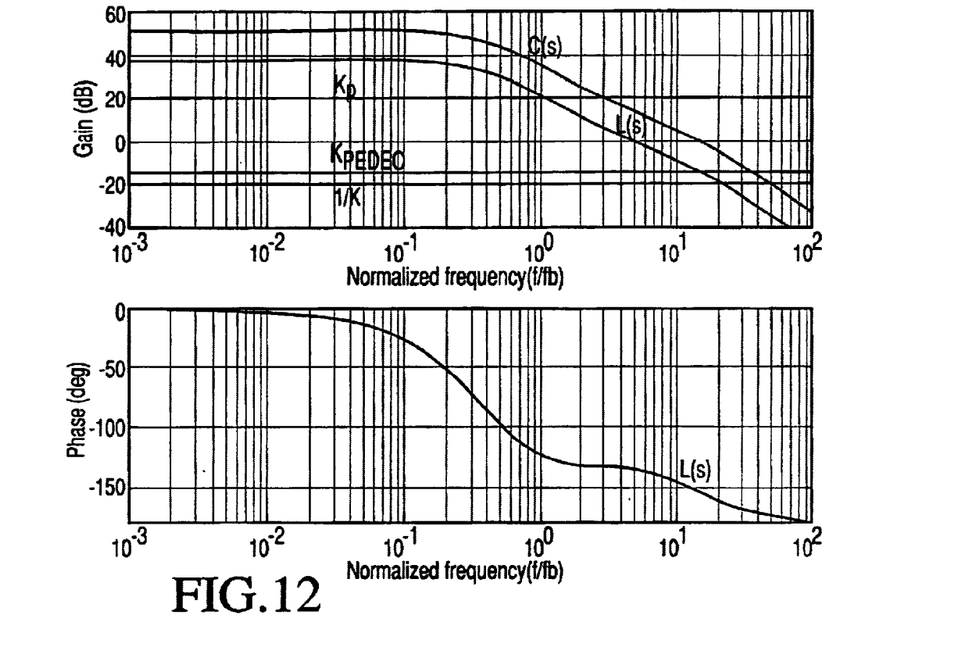
FIG. 12 shows the control loop characteristics for one preferred design approach for the preferred embodiment of FIG. 8.

The compensator DC gain $K_C$ is optimized to yield the desired loop bandwidth. A bandwidth of 6–8 times target bandwidth is a good compromise between efficiency and error correction capability. FIG. 12 shows Bode plots for each component and the resulting loop transfer function.

TABLE 1

Example of frequency normalized parameters

| Parameter | Value | Comment |
|---|---|---|
| $k_{PEDEC}$ | 0.2 | Equivalent PEDEC unit gain |
| K | 10 | System gain = 20dB |
| $K_P$ | 10 | Equivalent power stage gain = 20dB |
| $f_u$ | 6 | Bandwidth |
| $f_{p1} = \frac{1}{2\pi\tau_{p1}}$ | $\frac{f_w}{20}$ | Loop parameter |
| $f_{p2} = \frac{1}{2\pi\tau_{p2}}$ | $\frac{f_w}{20}$ | Loop parameter |
| $f_{p3} = \frac{1}{2\pi\tau_{p3}}$ | $2f_u$ | Loop parameter |
| $f_{z1} = \frac{1}{2\pi\tau_{z1}}$ | $\frac{f_w}{2}$ | Loop parameter |
| $f_f$ | 2 | Filter natural frequency |
| $Q_f$ | $\frac{1}{\sqrt{3}}$ | Filter Q (Bessel characteristic) |

The gain of the system is controlled by the A-block, and with the given example embodiment, the PEDEC control system will force the system gain to be constant within the target bandwidth. This stabilizes both system gain and the frequency response. According to the linear model for this example embodiment of the invention in FIG. 9, the resulting system response is constituted of two contributions, since the reference has two inputs in the loop. The system transfer function is:

$$H(s) = \underbrace{\frac{C(s)K_P k_{PEDEC}}{1+L(s)}}_{H_A} + \underbrace{\frac{K_P}{1+L(s)}}_{H_S} = \frac{K_P[C(s)k_{PEDEC}+1]}{1+L(s)} \quad (10)$$

In the special (but not unusual) case where $K=K_p$, the system transfer function is constant:

$$H(s) = \frac{K[C(s)k_{PEDEC}+1]}{1+C(s)k_{PEDEC}} = K \quad (11)$$

In the general case:

$$H(s) \approx \begin{cases} K & (f < f_u) \\ K_P & (f \gg f_u) \end{cases} \quad (12)$$

Figure 13:
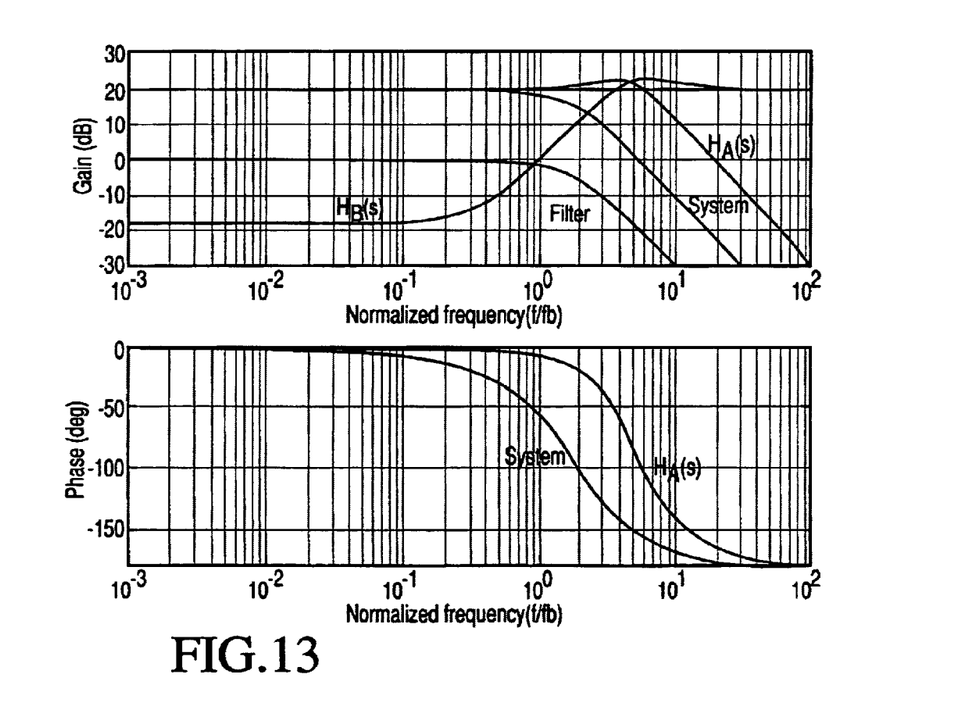
FIG. 13 shows the closed loop system characteristics for one preferred design approach for the preferred embodiment of FIG. 8.

FIG. 13 shows the resulting Bode plots for the closed system, consisting of two contributions forming the loop response and a total system response with the demodulation filter. The constant gain characteristic of the loop caused by $K=K_p$. The demodulation filter exclusively determines the response of the system.

The parameters of the example embodiment above are only illustrative and various other system characteristics can be devised by other loop transfer function gain/bandwidth compromises etc.

Figure 10:
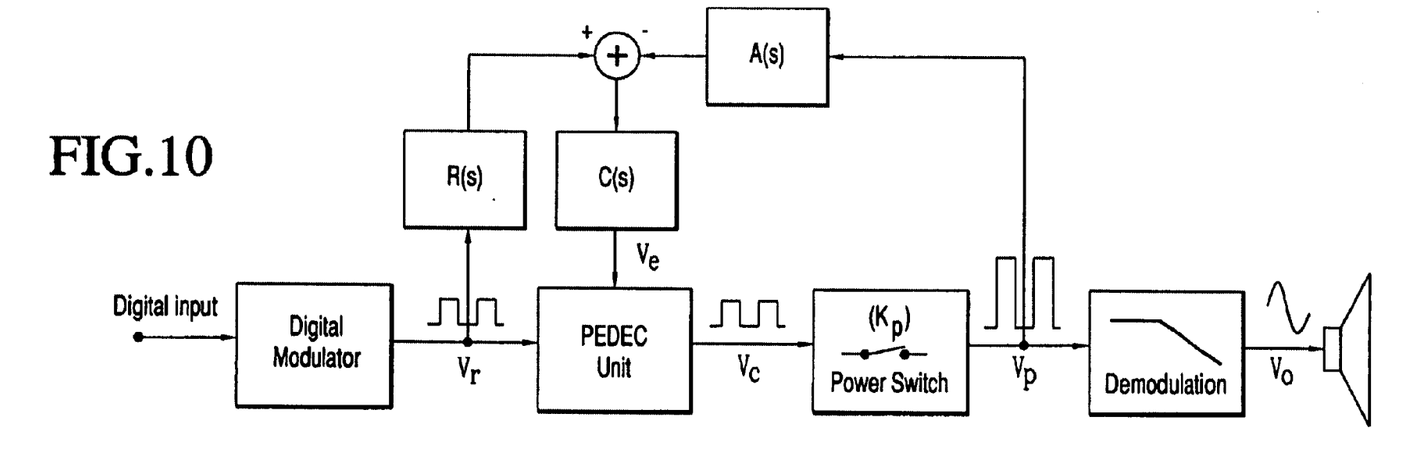
FIG. 10 shows yet another advantageous embodiment of the invention, in terms of a digital—power conversion system for audio purposes, where the reference shaping block and feed-back block have first order characteristics to improved error estimation.
Figure 11:
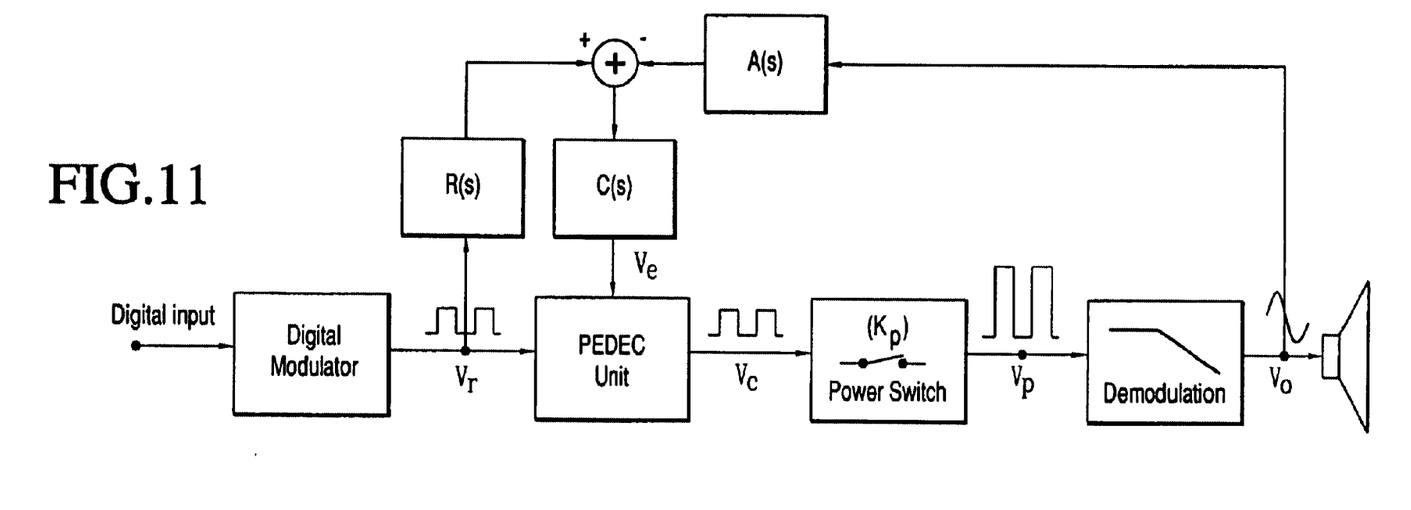
FIG. 11 shows yet another advantageous embodiment of the invention, in terms of a digital—power conversion system for audio purposes, where a global feedback source is used for error correction.

Other advantageous embodiments, also suitable for high quality digital to power conversion are shown FIG. 10 and FIG. 11. These alternative embodiments are characterized by using different compensator and reference shaping blocks. The embodiment in FIG. 10 is preferably based on a first order characteristic in both the reference shaping block R(s) and the feedback compensator A(s). The advantages in the demodulation of both reference and feedback signal are minimized noise within the control system and furthermore lower bandwidth requirements for the feedback compensator. The embodiment in FIG. 11 is based on a global feedback source such that demodulation filter errors are included within the loop and also corrected for. This requires a second order reference shaper for optimal error estimation.

Figure 14:
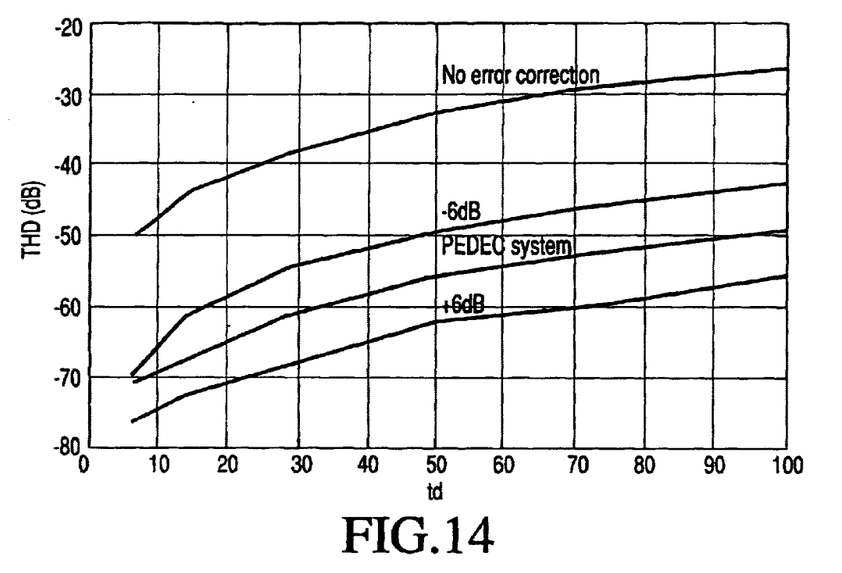
FIG. 14 shows the results of a simulation of error correction towards a deterministic pulse timing error source in the switching power stage. The example embodiment of the invention reduces the distortion considerably.
Figure 15:
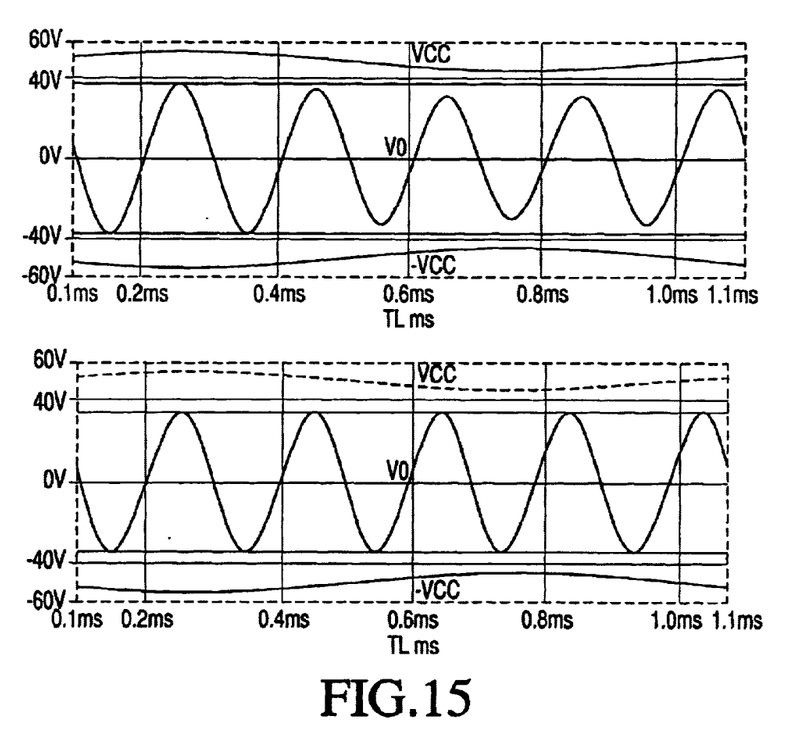
FIG. 15 shows a simulation of the effects of power supply perturbations. The example embodiment of the invention eliminates the intermodulation caused by this error source.

The correction effects towards pulse timing errors (PTE) is shown in FIG. 14, where THD for the open loop system and three PEDEC controller configurations have been investigated at the worst case signal frequency. Clearly, the controller considerably reduces the effects of this particular error source. Furthermore, adjusting the compensator gain $K_C$ can control the improvements. In this particular situation the distortion is reduced 20 dB–30 dB. FIG. 15 shows an investigation of PAE with a severe power supply perturbation of 10 Vpp. Top figure visualizes the clear intermodulation between power supply and signal. Bottom figure shows how the PEDEC controller eliminates this effect such that the intermodulation is no more visible in the time domain. The intermodulation distortion is reduced more than 40 dB compared to the open loop case, as predicted by the sensitivity function in theory.

Although the invention is described hereinbefore with respect to illustrative embodiments thereof, it will be appreciated that the foregoing and various other changes, omissions and additions may be made without departing from the spirit and scope of this invention.

What is claimed is:

1. A method of correct for a source of non-linearity and noise introduced in a switching power amplification stage during power amplification of a pulse modulated reference signal from a pulse modulator, comprising:
   generating a feedback signal from the switching power amplification stage;
   deriving an error signal by subtracting the feedback signal from the reference signal by a correction unit;
   re-timing the reference signal by introducing delays on pulse edges of the reference signal, based on the error signal derived by the correction unit; and
   controlling the delays so as to have a compensating effect on a power amplified signal output from the switching power amplification stage.

2. The method according to claim 1, further comprising introducing the delays on either a leading edge, a trailing edge or both edges of pulses of the reference signal.

3. The method according to claim 1, wherein the re-timing step includes generating a pulse width change $\Delta t_w$ in a switching cycle of the reference, controlled as a linear control function of an error signal $v_e$ to the correction unit, such that a general linear relation:

$$\Delta t_w = k_w \cdot v_e,$$

where $k_w$ is a constant, is established.

4. The method according to claim 1, further comprising shaping the error signal before performing the re-timing step.

5. The method according to claim 1, further comprising:
compensating the feedback signal; and
deriving the error signal by subtracting the compensated feedback signal from the reference signal.

6. A system to correct for a source of non-linearity and noise introduced in a switching power amplification stage during power amplification of a pulse modulated reference signal from a pulse modulator, comprising:
an input terminal receiving the reference signal;
a feedback path downstream from the switching power amplification stage having a feedback compensation block providing a compensated feedback signal;
a subtraction unit, arranged to derive an error signal by subtracting the compensated feedback signal from the reference signal; and
a correction unit arranged to receive the error signal, and adapted to introduce delays on pulse edges of the reference signal based on the error signal,
wherein the delays are controlled to have a compensating effect on a power amplified signal output from the switching power amplification stage.

7. The system according to claim 6, wherein control of the pulse edges of the reference signal is based on an integration of the reference signal to generate a signal $v_i$, such that a comparison of the signal $v_i$ with the error signal $v_e$ within the correction unit establishes a linear control function:

$$\Delta t_w = k_w \cdot v_e,$$

where kw is a constant.

8. The system according to claim 6, further comprising:
a compensator connected between the subtraction unit and the correction unit, and adapted to shape the error signal.

9. The system according to claim 8, wherein the compensator comprises a first order filter.

10. The system according to claim 6, wherein the feedback path is from the output of the switching power amplification stage.

11. The system according to claim 10, wherein the feedback compensation block comprises a constant attenuation block.

12. The system according to claim 10, further comprising:
a reference shaping block connected between the input terminal and the subtraction unit,
wherein the reference shaping block and the feedback compensation block include filters of at least a first order.

13. The system according to claim 6, further comprising:
a demodulation filter connected to the output of the switching power amplification stage.

14. The system according to claim 13, wherein the feedback path is from the output of the demodulation filter.

15. The system according to claim 14, wherein the feedback compensation block comprises a constant attenuation block.

16. The system according to claim 14, comprising:
a reference signal shaping block comprising a second order filter connected between the input terminal and the subtraction unit.

17. The system according to claim 6, wherein the reference signal comprises a pulse width modulated (PWM) signal.

18. The system according to claim 6, wherein the input terminal receives a digital pulse code modulated (PCM) signal, and the power amplified signal from the switching power amplification stage is converted to an analog signal.

19. The system according to claim 6, wherein pulses from the switching power amplification stage output drive a load.

20. The system according to claim 19, wherein the load includes a loudspeaker.

21. The system according to claim 6, wherein the system is incorporated into a power amplifier.

* * * * *